United States Patent [19]

Stanbury et al.

[11] Patent Number: 5,184,119
[45] Date of Patent: Feb. 2, 1993

[54] UNAUTHORIZED UTILITY USE MONITOR APPARATUS AND METHOD

[75] Inventors: Evan J. Stanbury, Lakemba; Lloyd S. Thomas, Gordon, both of Australia

[73] Assignee: Alcatel Australia Limited, Alexandria, Australia

[21] Appl. No.: 548,715

[22] Filed: Jul. 6, 1990

[30] Foreign Application Priority Data

Jul. 11, 1989 [AU] Australia ............... PJ 5156

[51] Int. Cl.⁵ ............................ H04B 1/00
[52] U.S. Cl. ..................... 340/825.60; 324/110
[58] Field of Search ............ 340/825.02, 825.06, 340/870.02, 870.03, 310 A, 825.07, 825.08, 825.10, 825.15, 825.16, 825.17; 379/107, 106; 324/110, 116

[56] References Cited

U.S. PATENT DOCUMENTS

| | | | |
|---|---|---|---|
| 4,240,030 | 12/1980 | Bateman et al. | 324/110 |
| 4,351,028 | 9/1982 | Peddie et al. | 379/107 |
| 4,396,844 | 8/1983 | Miller et al. | 307/39 |
| 4,532,471 | 7/1985 | Hurley | 324/110 |
| 4,700,188 | 10/1987 | James | 324/110 |
| 4,727,315 | 2/1988 | Jones | 324/110 |
| 4,731,575 | 3/1988 | Sloan | 324/116 |
| 4,803,632 | 2/1989 | Frew et al. | 364/464 |
| 4,819,180 | 4/1989 | Hedman et al. | 364/492 |
| 4,850,010 | 7/1989 | Stanbury et al. | 329/107 |

*Primary Examiner*—Donald J. Yusko
*Assistant Examiner*—Dervis Magistre
*Attorney, Agent, or Firm*—Spencer, Frank & Schneider

[57] ABSTRACT

A system for monitoring use of a utility at a consumer's premises is disclosed. The system may include monitoring apparatus to detect use of the utility, a first register to store an indicator signal indicating whether or not use of the utility at the consumer's premises is authorized, and an unauthorized use signal generator, responsive to the monitoring apparatus output and the contents of the register, to generate an unauthorized use signal when the monitoring apparatus output indicates use of the utility and the first register contains an indicator signal indicating that use is not authorized.

6 Claims, 1 Drawing Sheet

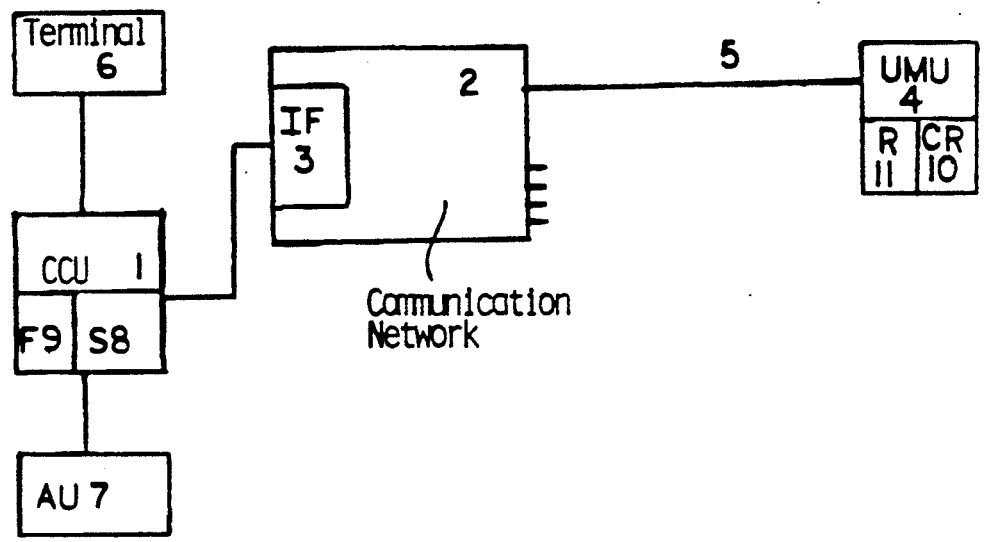

UNAUTHORIZED UTILITY USE MONITOR APPARATUS AND METHOD

CROSS REFERENCE TO RELATED APPLICATION(S)

This application claims the priority of application Ser. No. PJ 5156, filed on Jul. 11th, 1989 in Australia, the subject matter of which is incorporated herein by reference.

BACKGROUND OF THE INVENTION

This invention is directed to the problem of unauthorized use of utilities such as electricity, gas or water in vacant premises. Such use may occur when a house is sold or a tenant moves out of a flat, e.g., apartment or the like. While applicable to most utilities, the invention will be described in terms of the electricity supply to a flat.

The vacating occupier should notify the supply authority which arranges to read the meter to prepare a final account. If use is made of the electricity supply after that time but before the ene occupier moves in, the new occupier may be required to pay for electricity he did not use.

One method of overcoming this is to disconnect the supply when the flat is vacated and to reconnect it when the new occupant moves in. However, this is costly and inconvenient as it requires two visits by the linesman.

In our earlier Australian Patent Application No. 586716, corresponding to U.S. Pat. No. 4,850,010, the subject matter of which is hereby incorporated by reference, we disclosed a utility management system in which a utility control center is connected to the consumer's meters via the telephone network. The control center is able to read the meters and send command signals to the consumer's premises, e.g., to perform off-peak switching. In a preferred embodiment the meter readings are stored in electronic memories under the control of a micro-processor.

The present invention proposes a system which offers a simpler and more convenient solution to the problem of unauthorized use.

SUMMARY OF THE INVENTION

This specification discloses a system for monitoring use of a utility at a consumer's premises, the system comprising monitor means to detect use of the utility, a first register to store an indicator signal indicating whether or not use of the utility at the consumer's premises is authorized, an unauthorized use signal generating means responsive to the monitor output and the contents of the register to generate an unauthorized use signal when the monitor output indicates use of the utility and the first register contains an indicator signal indicating that use is not authorized.

In a preferred embodiment there is disclosed a utility management system comprising a central control unit connected to the meters of each of a plurality of consumers via a communication network, wherein at each subscriber's premises there are transponder means responsive to a command received over the communication network to cause the meter reading to be transmitted to the central control unit, wherein the system includes electronic storage means to store individual readings from each respective consumer's meter, the system further including means to store an "indicating flag" bit indicative of whether or not the consumption is authorized, means to detect consumption on a consumer's meter (e.g., by comparing successive readings from each consumer's meter or by counting pulses from the meter), and alarm means responsive to the detection means to produce an alarm signal when unauthorized use occurs.

BRIEF DESCRIPTION OF THE DRAWINGS

The single Figure is a block diagram of one embodiment of the system of the present invention.

DESCRIPTION OF THE PREFERRED EMBODIMENT

The invention is more fully described in relation to the accompanying drawing in which the central control unit (CCU) 1 is shown connected to a communications network 2 through a suitable communications interface (IF) 3. A plurality of utility management units (UMU) 4, one at each consumer's premises, are connected to the communications network 2, e.g., by individual phone lines 5. Only one UMU 4 is shown for simplicity of illustration.

In this system the utility provider can interrogate each UMU 4 from the CCU 1 via the communication network 2, or the UMU 4 can send a message to CCU 1 via communications network 2, at any time. The UMU 4 provides data indicating the contents of one or more consumption register (CR) 10, and the data from each UMU 4 is stored in an associated store (S) 8 at the CCU 1. If the first occupier has notified the utility provider that he has vacated the premises, this information is fed into a corresponding "flag bit" store (F) 9 in the CCU 1 via terminal 6 to indicate that further consumption from the UMU is unauthorized. The UMU 4 continually monitors consumption via an external or internal meter (not shown) and the CCU 1 regularly monitors the UMU 4 (e.g., once per day). If the consumption exceeds a known threshold, the CCU 1 provides an alarm signal to drive alarm unit (AU) 7. The alarm signal may alternatively appear as part of a screen display or printout.

On receipt of the alarm indication the utility provider can initiate inquiries (e.g., via the phone) to alert the new occupier to his obligation to open an account or, failing a satisfactory response, can initiate a shutdown of the supply either via the CCU 1 to cause a relay (R) 11 controlled by the UMU 4 to disconnect the consumer, or by sending a linesman to disconnect the supply. Suitable relays 11 are expensive and the second option may prove cheaper.

When a new tenant notifies the provider that he has moved in, the authorization flag bit 9 can be reset.

Thus according to this method it is only necessary to disconnect and reconnect when illegal use is indicated.

In an alternative embodiment, the authorization flag bit 9 and comparison may be incorporated in the UMU 4, with the authorization flag set by instruction from the CCU 1, and the UMU 4 processor sending the alarm signal to the CCU 1 via communication network 2. This has the advantage of reducing communications traffic at the CCU 1, since many UMUs 4 do not need the meter read on a daily basis, and reduces the time to detect theft, since the UMU 4 can typically report an alarm in 5 minutes, while the CCU 1 would only check at infrequent intervals (e.g., daily).

In one embodiment, the alarm is raised when energy consumed exceeds a threshold. This embodiment may be implemented by clearing a counter (not shown)

when the alarm is first enabled. The counter is incremented for each unit of consumption and, when the threshold is exceeded, the alarm is raised. In a further embodiment, the alarm is raised when power consumption exceeds a threshold (e.g., the meter itself or the wiring may consume a small amount of power). In this embodiment the counter is cleared on a regular basis to prevent false alarms due to noise pulses etc.

The system is quite flexible and may be used to monitor supply on several circuits at a consumer's premises. A scheme of off-peak power is provided by certain electricity utilities, where thermal storage devices may be permitted power at certain times of the day, at a reduced cost. For instance, off-peak hot water may be registered in a first set of registers (not shown) and the remaining circuits could be recorded in a second set of registers (not shown), provided there is a separate meter for each set of circuits. The consumer's circuits could be further subdivided at the cost of additional meters and registers so consumption from specific power outlets would be monitored.

In a further embodiment consumption at different times of day could be monitored by the use of time of day registers (not shown). Thus, by flagging time of day registers, it is possible to detect unauthorized use, e.g., while the occupier is absent, or while the off-peak supply should be off. This could then be used to trigger a burglar alarm.

It will be understood that the above description of the present invention is susceptible to various modifications, changes, and adaptations, and the same are intended to be comprehended within the meaning and range of equivalents of the appended claims.

What is claimed is:

1. A system for monitoring unauthorized use of a utility at each of a plurality of consumer's premises, the system including:
    a consumer meter at each consumer's premises, the consumer meter being connected to measure use of the utility;
    a local processor, including at least one memory register, at each consumer's premises operatively coupled to the consumer meter and for storing readings from the corresponding consumer meter, each consumer meter and local processor comprising a subscriber unit;
    a communications network;
    first communication means operatively coupled to the local processor and to the communications network, and disposed at each consumer's premises, for facilitating communication over the network with the subscriber unit;
    a central processor at a central location including storage means for storing information concerning each consumer's premises;
    second communication means operatively coupled to the communications network and the central processor, and disposed at the central location, for enabling information to be transmitted selectively between the central processor and each local processor via the communication network and the respective first communication means;
    information input means operatively coupled to the central processor for generating an authorization signal for each consumer's premises, the storage means storing an authorization signal for each consumer's premises indicative of whether use of the utility is authorized or is not authorized;
    wherein the central processor periodically polls each local processor to detect consumption of the utility, verifies whether or not consumption is authorized by checking the corresponding authorization signal in the storage means, and generates an unauthorized use signal when unauthorized use is detected at a corresponding consumer's premises.

2. A system as claimed in claim 1 further comprising:
    utility cut-off means at each consumer's premises for connecting and disconnecting the utility to the consumer's premises; and
    control means at each subscriber unit operatively coupled the utility cut-off means and to the first communication means, for causing the utility cut-off means to disconnect the utility to the consumer's premises in responsive to a cut-off command from the central processor.

3. A system as claimed in claim 2 wherein the control means are responsive to a reconnect signal from the central processor to cause the cut-off means to connect the utility to the consumer's premises.

4. A system for monitoring unauthorized use of a utility at each of a plurality of subscriber's premises, the system comprising:
    a consumer meter at each subscriber's premises, the consumer meter being connected to measure use of the utility;
    a local processor, including at least one memory register, at each subscriber's premises operatively coupled to the corresponding consumer meter, for storing readings from the corresponding consumer meter, each consumer meter and local processor comprising a subscriber unit, the local processor having an authorization signal register for storing an authorization signal;
    a communication network;
    first communication means operatively coupled to the local processor and to the communications network, and disposed at each subscriber's premises, for facilitating communication over the network with the subscriber unit;
    a central processor at a central location;
    second communication means disposed at the central location and operatively coupled to the central processor and to the communication network, for enabling information to be transmitted selectively between the central processor and each local processor via the communication network and the respective first communication means;
    information input means operatively coupled to the central processor, for generating an authorization signal for each subscriber's premises, the central processor transmitting the authorization signal to the corresponding local processor which stores the authorization signal in the corresponding authorization signal register;
    wherein each local processor verifies whether or not consumption of the utility is authorized at the corresponding subscriber's premises in accordance with the signal in the authorization signal register and transmits an unauthorized use signal to the central processor when use which is not authorized is detected at the corresponding subscriber's premises.

5. A system as claimed in claim 4 further comprising:
    utility cut-off means at each subscriber's premises for connecting and disconnecting the utility to the subscriber's premises; and control means operatively coupled to the utility cut-off means and to the first communications means, and disposed at each subscriber's premises and for causing the utility cut-off means to disconnect the utility to the subscriber's premises in response to a cut-off command from the central processor.

6. A system as claimed in claim 5 wherein the control means are responsive to a reconnect signal from the central processor to cause the cut-off means to connect the utility to the subscriber's premises.

* * * * *